United States Patent
Noguchi

(10) Patent No.: US 6,284,614 B1
(45) Date of Patent: Sep. 4, 2001

(54) METHOD OF MANUFACTURING SEMICONDUCTOR DEVICE IN WHICH DAMAGE TO GATE INSULATING FILM CAN BE REDUCED

(75) Inventor: Ko Noguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/369,927

(22) Filed: Aug. 9, 1999

(30) Foreign Application Priority Data

Aug. 31, 1998  (JP) .................................................. 10-245445

(51) Int. Cl.$^7$ ................................................. H01L 21/8222
(52) U.S. Cl. ........................... 438/328; 438/237; 438/288; 438/131; 438/600
(58) Field of Search ..................................... 438/328, 197, 438/131, 237, 288, 132, 210, 600

(56) References Cited

U.S. PATENT DOCUMENTS

| | | | |
|---|---|---|---|
| 5,111,262 | * | 5/1992 | Chen et al. . |
| 5,350,710 | * | 9/1994 | Hong et al. . |
| 5,393,701 | * | 2/1995 | Ko et al. . |
| 5,691,234 | | 11/1997 | Su et al. . |

FOREIGN PATENT DOCUMENTS

| | | |
|---|---|---|
| 59-123268 | 7/1984 | (JP) . |
| 6-181220 | 6/1994 | (JP) . |
| 6-232360 | 8/1994 | (JP) . |
| 7-24261 | 3/1995 | (JP) . |
| 10-4092 | 1/1998 | (JP) . |

* cited by examiner

*Primary Examiner*—Tuan H. Nguyen
(74) *Attorney, Agent, or Firm*—McGinn & Gibb, PLLC

(57) ABSTRACT

A method of manufacturing a semiconductor device includes (a) providing a semiconductor substrate of a first conductive type, (b) forming a field insulating film on the semiconductor substrate, and (c) providing a first region and a second region in which the field insulating film is not formed on the semiconductor substrate. Also, the method includes (d) forming a gate insulating film on both the first region and the second region at a same time, (e) removing the gate insulating film formed on the second region to expose a surface portion of the semiconductor substrate, and (f) forming a diffusion layer of the first conductive type in the second region from which the gate insulating film is removed. Further, the method includes (g) forming a gate electrode after the (f) step such that the gate electrode is in contact with at least a portion of respective the first region and the second region and (h) changing the diffusion layer into a diffusion layer of a second conductive type different from the first conductive type, after the (g) step.

25 Claims, 9 Drawing Sheets

METHOD OF MANUFACTURING SEMICONDUCTOR DEVICE IN WHICH DAMAGE TO GATE INSULATING FILM CAN BE REDUCED

BACKGROUND OF THE INVENTION

1. Field of the Invention

The present invention relates to a method of manufacturing a semiconductor device. More particularly, the present invention relates to a method of manufacturing a semiconductor device to realize a reduction of a damage to a gate insulating film resulting from a process of manufacturing a semiconductor, namely, a plasma damage to a gate insulating film.

2. Description of the Related Art

When semiconductor devices are manufactured, various plasma processes are used. The plasma processes include a dry etching, an ashing, a film deposition by means of a plasma CVD method and the like. The plasma implies the existence of an ion having a positive charge and an electron having a negative charge. In this plasma, a balance between the number of the positive charges and the number of the negative charges is usually maintained, and thus, there is no electrical polarization.

However, there may be a case in which the numbers of the positive and the negative charges are not locally uniformed. Thereby an electrical balance is not achieved. In this case, if there is a conductor on a surface of a semiconductor device, the charges in the plasma flow into the semiconductor substrate by way of a gate electrode and a gate insulating film. Thus, a large amount of current flow results in serious problems such as damage or breakdown of the gate insulating film, reliability degradation of LSI, yield loss of LSIs.

Mechanism in which the gate insulating film is damaged will be described below with reference to FIGS. 1 to 6.

FIG. 1 shows a situation after a gate electrode 5 is plasma-etched with a photo resist 8 as a mask. A field insulating film 2 is formed on a P-type semiconductor substrate 1. A gate insulating film 3 is formed on a region surrounded by the field insulating film 2. A gate electrode 5 is formed on the gate insulating film 3, and part of the gate electrode extends on the field insulating film 2.

There is a photo resist 8 having a predetermined shape on the gate electrode 5. A portion of the gate electrode 5 which is not covered with the photo resist 8, namely, a side wall portion 5a is directly exposed to the plasma in the plasma-etching process. As a result, the charges of the plasma flow from the side wall portion 5a into the gate electrode 5. Thus, the gate electrode 5 is electrically charged.

If the amount of the charge is sufficiently large, the charges pass through the gate insulating film 3 and flow into the P-type semiconductor substrate 1. The gate insulating film 3 is damaged when the charges pass through the gate insulating film 3.

FIG. 2 shows a situation after a contact hole is formed in an interlayer insulating film 11. The interlayer insulating film 11 is formed on the entire surface containing the gate electrode 5. A photo resist 12 having a predetermined shape is formed on the interlayer insulating film 11. A hole 5d which penetrates the interlayer insulating film 11 and reaches the gate electrode 5 is formed by the plasma-etching with a photo resist 12 as a mask. A surface portion 5e of the gate electrode 5 is exposed to the plasma, even in this case. Accordingly, the gate insulating film 3 is damaged by the reason similar to the above-mentioned reason.

The following method has been traditionally known as one method of protecting the gate insulating film from being damaged. This is the method of providing an alternate route for the current from the plasma into the semiconductor substrate so that the current from the plasma does not flow into the gate insulating film.

FIGS. 3 to 6 show a method of manufacturing a semiconductor element disclosed in U.S. Pat. No. 5,691,234. This method is a technique referred to as a substrate direct contact or a substrate buried contact.

As shown in FIG. 3, the field insulating films 2 for isolating the elements are formed on the P-type semiconductor substrate 1. The gate insulating film 3 is formed on the regions in which the field insulating films 2 are not formed on the P-type semiconductor substrate 1. Then, as shown in FIG. 4, a part of the gate insulating film 3 is removed. As a result, a substrate contact portion 7 in which the surface of the semiconductor substrate 1 is exposed is formed on the P-type semiconductor substrate 1.

Next, a gate electrode 5 having a predetermined shape is formed on a region containing the field insulating film 2, the gate insulating film 3 and the substrate contact portion 7, as shown in FIG. 5. Moreover, N-type impurity 9a is implanted from the substrate contact portion 7 to the P-type semiconductor substrate 1. As a result, an N-type diffusion layer 10a is formed in the substrate contact portion 7 of the semiconductor substrate 1, as shown in FIG. 6.

As a result, a diode is formed by the N-type diffusion layer 10a and the P-type semiconductor substrate 1. The gate electrode 5 is formed to be in contact with the diode.

This diode functions as described below to protect the device from charging in the plasma process. Polarity of the charging caused by the plasma can be either positive or negative.

If the gate electrode 5 is positively charged, the current does not flow when the charging is small and a voltage is low because the diode does not turn into the breakdown state. When the degree of positive charging is large and the voltage exceeds a certain value, then the diode breakdown occurs. In this case, a large amount of current flow into the P-type semiconductor substrate 1.

On the other hand, if the gate electrode 5 is negatively charged, the diode is biased in a forward direction. As a result, even a low voltage enables the current to flow into the P-type semiconductor substrate 1. Accordingly, the diode of the substrate contact portion 7 can protect the gate electrode 5 from being charged.

However, the above-mentioned conventional method has the problems as described below.

A voltage equal to or higher than a certain value is necessary for the breakdown of the diode, if the voltage applied to the gate electrode 5 is positive. That is, the protection function does not act in a case of the voltage equal to or less than the certain voltage. As an example, let us suppose that a thickness of the gate insulating film is 6 nano-meters. In this case, a breakdown voltage of the gate insulating film 3 is about 8 volts. A breakdown voltage of the diode of the substrate contact portion 7 is about 9 volts. Thus, the gate insulating film 3 is broken before the current flows from the diode into the P-type semiconductor substrate 1.

As the gate insulating film 3 becomes further thinner, the breakdown voltage of the gate insulating film 3 becomes lower. However, the breakdown voltage of the diode can not be substantially changed. Hence, it becomes more difficult to protect the gate insulating film 3 from being damaged.

Therefore, an object of the present invention is to provide a method of manufacturing a semiconductor device in which the above-mentioned problems in the conventional method can be overcome, and especially a gate insulating film can be protected regardless of the polarity of the charging of the gate electrode.

The following method of manufacturing a semiconductor device is disclosed in Japanese Laid Open Patent Application (JP-A-Heisei 10-4092). An insulation layer is formed on a silicon substrate on which a MOS-type field effect transistor is formed. Titanium nitride and tungsten are buried in an open contact hole. Aluminum film, titanium nitride film and silicon oxide film are formed in turn. The silicon oxide film is patterned. Then, the aluminum film is anisotropically etched with the silicon oxide film as a mask. In this case, a part of the aluminum film is left on the insulation layer without perfectly separating various wiring patterns. Next, a side wall is formed on the aluminum film by deposition of the silicon oxide film and etch-back. After this, the aluminum film left on the insulation layer is etched and then the wiring is formed, which solves the above-mentioned charging problems.

The following method of manufacturing a semiconductor device is disclosed in Japanese Laid Open Patent Application (JP-A-Heisei 6-181220). This method includes the following steps. That is, a gate electrode layer and a semiconductor substrate are short-circuited in a semiconductor device, and a gate electrode is formed through an gate insulating film on the semiconductor substrate. After that, an ion implantation or a plasma process is performed to then cut away a wiring layer through which the gate electrode layer and the semiconductor substrate are short-circuited.

The following method of manufacturing a semiconductor device is disclosed in Japanese Laid Open Patent Application (JP-A-Heisei 6-232360). An N-channel MOS gate oxide film and a P-channel MOS gate oxide film are formed on a surface of a P-type silicon substrate. N-type impurity is implanted into the P-type silicon substrate through a polysilicon layer on the gate oxide film. Accordingly, a protection diode electrically connected to the polysilicon layer is formed on the P-type silicon substrate. Next, the polysilicon layer is patterned to form a gate electrode. Then, an insulating film is formed on the gate electrode, a contact hole is formed on the insulating film, and an Al wiring electrically connected to the gate electrode is formed inside the contact hole and on the insulating film. Thus, it is possible to suppress the damage concentration on the gate oxide film.

The following method of manufacturing a semiconductor device is disclosed in Japanese Laid Open Patent Application (JP-B-Heisei 7-24261). This is a method of manufacturing a semiconductor device having polycide gate structure, and comprises a step of forming a gate insulating film on a semiconductor substrate, a step of a forming a polysilicon layer on this gate insulating film, a step of selectively removing the polysilicon layer and the gate insulating film and forming a hole that reaches a semiconductor substrate, a step of contacting directly with the semiconductor substrate exposed by the hole and the polysilicon layer and then forming a silicide layer and a step of performing ion implantation.

The following method of manufacturing a MOS semiconductor device is disclosed in Japanese Laid Open Patent Application (JP-A-Showa 59-123268). This method comprises a step of providing a wiring layer formed of polysilicon in which part thereof is used as a gate electrode, a step of forming the wiring layer formed of the polysilicon so that when it is connected to an output end of a drive circuit for driving the wiring layer, part thereof is in contact with a semiconductor region serving as the output end of the drive circuit, and a step of forming a metallic wiring layer so as to connect the semiconductor region and the wiring layer formed of the polysilicon to each other after that.

SUMMARY OF THE INVENTION

The present invention has been made to solve the above-described problems of the conventional method of manufacturing a semiconductor device. An object of the present invention is to provide a method of manufacturing a semiconductor device in which damage to gate insulating film can be reduced. Another object of the present invention is to provide a method of manufacturing a semiconductor device in which a gate insulating film is protected from charging regardless of the polarity of the charging of a gate electrode.

In order to achieve an aspect of the present invention, a method of manufacturing a semiconductor device includes (a) providing a semiconductor substrate of a first conductive type, (b) forming a field insulating film on the semiconductor substrate, (c) providing a first region and a second region in which the field insulating film is not formed on the semiconductor substrate, (d) forming a gate insulating film on both the first region and the second region at a same time, (e) removing the gate insulating film formed on the second region to expose a surface portion of the semiconductor substrate, (f) forming a diffusion layer of the first conductive type in the second region from which the gate insulating film is removed, (g) forming a gate electrode after the (f) step such that the gate electrode is in contact with at least a portion of the second region and (h) changing the diffusion layer into a diffusion layer of a second conductive type different from the first conductive type, after the (g) step.

In order to achieve another aspect of the present invention, a method of manufacturing a semiconductor device, includes (i) providing a semiconductor substrate of a first conductive type, (j) forming a field insulating film on the semiconductor substrate, (k) providing a first region and a second region in which the field insulating film is not formed on the semiconductor substrate, (l) forming a gate electrode through a gate insulating film in the first region, (m) forming the first conductive type of diffusion layer in the second region, (n) connecting the gate electrode through the diffusion layer to the semiconductor substrate, (o) changing the diffusion layer into a diffusion layer of a second conductive type different from the first conductive type and (p) connecting the gate electrode to the semiconductor substrate, through a diode of the second conductive type of diffusion layer and the semiconductor substrate.

In this case, the (h) step includes implanting ions of the second conductive type into the diffusion layer of the first conductive type.

Also in this case, the (h) step includes changing a whole of the first conductive type of diffusion layer into the second conductive type of diffusion layer such that the first conductive type of diffusion layer does not remain.

Further in this case, the (c) step includes providing two the first regions such that one of the two first regions is provided in a well of the second conductive type formed in the semiconductor substrate, and the method further includes (q) forming a field effect transistor of the first conductive type and a field effect transistor of the second conductive type, respectively, in the two first regions.

In this case, the (g) step includes forming the gate electrode as a single one common to both the first conductive type of field effect transistor and the second conductive type of field effect transistor such that the gate electrode is connected through the second region to the semiconductor substrate.

In order to achieve still another aspect of the present invention, a method of manufacturing a semiconductor device, includes (r) providing a semiconductor substrate of a first conductive type and a gate electrode on a gate insulating film above the semiconductor substrate, (s) short-circuiting the gate electrode to the semiconductor substrate and (t) using plasma process after the (s) step, wherein the (s) includes forming a diffusion layer of the first conductive type in the semiconductor substrate such that the diffusion layer is connected to the gate electrode.

In this case, the method further includes (u) electrically separating the gate electrode and the semiconductor substrate from each other, after the (t) step.

Also in this case, the (u) step includes implanting impurity of a second conductive type different from the first conductive type into the diffusion layer to change the diffusion layer into a diffusion layer of the second conductive type.

Further in this case, the (t) step includes etching the gate electrode with the plasma.

In this case, the (t) step includes etching an insulating film formed on the gate electrode with the plasma to form a hole reaching the gate electrode.

Also in this case, the (t) step includes etching an insulating film formed on the gate electrode with the plasma to form a hole reaching the gate electrode, and the (u) step includes implanting impurity of a second conductive type different from the first conductive type into the diffusion layer through the hole to change the diffusion layer into a diffusion layer of the second conductive type.

In order to achieve yet still another aspect of the present invention, a method of manufacturing a semiconductor device, includes (aa)providing a semiconductor substrate of a first conductive type, (ab)forming a field insulating film on the semiconductor substrate, (ac)providing a first region and a second region in which the field insulating film is not formed on the semiconductor substrate, (ad)forming a gate insulating film on the first region and the second region, (ae)removing the gate insulating film formed on the second region to expose a surface portion of the semiconductor substrate, (af)forming a gate electrode on the gate insulating film of the first region and on the second region in which the surface portion of the semiconductor substrate is exposed, (ag)implanting impurity of the first conductive type into the second region to form a diffusion layer of the first conductive type, (ah)etching the gate electrode such that the gate electrode is in contact with a first portion of the diffusion layer and a second portion of the diffusion layer is exposed, (ai) forming an interlayer insulating film on the gate electrode and the diffusion layer, (aj)etching the interlayer insulating film to form a hole reaching the gate electrode and the diffusion layer and (ak)implanting impurity of a second conductive type different from the first conductive type through the hole into the diffusion layer to form a diffusion layer of the second conductive type.

In this case, the method further includes (al)filling conductive material in the hole.

Also in this case, the (ah) step includes etching the gate electrode with plasma.

Further in this case, the (aj) step includes etching the interlayer insulating film with plasma.

In order to achieve another aspect of the present invention, a method of manufacturing a semiconductor device, includes (am)providing a semiconductor substrate of a first conductive type, (an)forming a field insulating film on the semiconductor substrate, (ao)providing first and second regions in which the field insulating film is not formed on the semiconductor substrate, (ap)forming a gate insulating film on the first and second regions, (aq)implanting impurity of the first conductive type into the second region to form a diffusion layer of the first conductive type, (ar)after the (aq) step, removing at least a portion of the gate insulating film in the second region to expose a surface portion of the semiconductor substrate, (as)forming a gate electrode on the first and second regions and the field insulating film, (at) etching the gate electrode such that the gate electrode covers an entire surface portion of the diffusion layer, (au)forming an interlayer insulating film on the gate electrode, (av) etching the interlayer insulating film such that a hole reaching the gate electrode is formed and (aw)implanting impurity of a second conductive type different from the first conductive type into the diffusion layer through the hole to form a diffusion layer of the second conductive type.

In this case, the method further includes (ax)filling conductive material in the hole.

Also in this case, the (at) step includes etching the gate electrode with plasma.

Further in this case, the (av) step includes etching the interlayer insulating film with plasma.

In order to achieve still another aspect of the present invention, a method of manufacturing a semiconductor device, includes (ba)providing a semiconductor substrate of a first conductive type, (bb)forming a field insulating film on the semiconductor substrate, (bc)providing first, second and third regions in which the field insulating film is not formed on the semiconductor substrate, wherein the first region is a region to be a diffusion layer of a second conductive type different from the first conductive type, and the third region is a region to be a diffusion layer of the first conductive type, (bd)forming a gate insulating film on the first and third regions, (be)forming a diffusion layer of the first conductive type in the second region, (bf)forming a gate electrode on the gate insulating film in the first and third regions, the diffusion layer in the second region and the field insulating film and (bg)changing the diffusion layer into a diffusion layer of the second conductive type.

BRIEF DESCRIPTION OF THE DRAWINGS

A more complete understanding of the teachings of the present invention may be acquired by referring to the accompanying figures, in which like reference numbers indicate like features and wherein.

DESCRIPTION OF THE PREFERRED EMBODIMENTS

Embodiments of a method of manufacturing a semiconductor device according to the present invention will be described below with reference to the attached drawings.

This embodiment meets the following items (A) to (F).

(A) A first region and a second region surrounded with a field insulating film are formed on a surface portion of a semiconductor substrate of a first conductive type.

(B) A gate insulating film is formed in the first region and the second region.

(C) Only the gate insulating film formed in the second region is removed.

(D) A diffusion layer of the first conductive type is formed in the second region in which the gate insulating film is removed.

(E) After (D), a gate electrode is formed to be contact with at least a portion of the first region and the second region.

(F) After (E), the diffusion layer of the first conductive type is changed into a diffusion layer of a second conductive type.

When the gate electrode is formed, a part of the gate electrode is in direct contact with a semiconductor substrate to maintain a state of electric short-circuit. After the formation of a contact hole, ions having an opposite conductive type to that of the semiconductor substrate are implanted into a portion that is in contact with the semiconductor substrate. Thus, a diode connection is formed on the semiconductor substrate when the contact portion between the gate electrode and the semiconductor substrate is changed into a diode connection.

As a result, the gate electrode is short-circuited to the semiconductor substrate from the step of forming the gate electrode prior to the step of forming the diode. Thus, even if the gate electrode is charged, charges can be easily guided into the semiconductor substrate. Hence, the plasma damage to the gate insulating film can be effectively avoided.

First to third embodiments will be described below in detail with reference to the drawings.

(First Embodiment)

Figure 17:
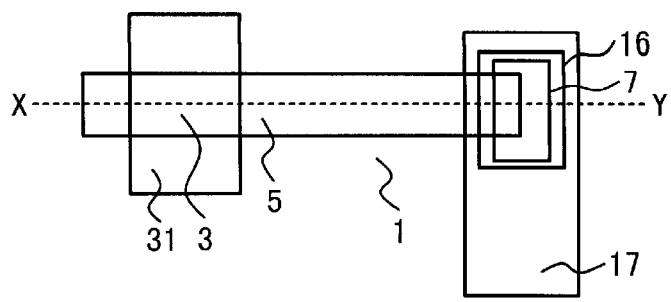
FIG. 17 is a plan view of FIG. 16.

FIGS. 7 to 16 are section views showing a manufacturing process of the first embodiment. FIG. 17 is a plan view of FIG. 16 (an X-Y section of FIG. 17 corresponds to FIG. 16). The following items are shown in FIGS. 7 to 16.

The first embodiment meets the following items (G) to (O).

(G) A field insulating film 2 is formed on a surface portion of a P-type semiconductor substrate 1.

(H) A first region 31 surrounded with the field insulating film 2 is provided.

(I) A second region 7 surrounded with the field insulating film 2 is provided.

(J) A gate insulating film 3 is simultaneously formed on the first region 31 and the second region 7.

(K) A gate electrode 5 is formed on the gate insulating film 3.

(L) Only the gate insulating film 3 formed on the second region 7 of the simultaneously formed gate insulating film 3 is removed.

(M) A P-type diffusion layer 10 is formed in the second region 7 in which the gate insulating film 3 is removed.

(N) After (M), the gate electrode 5 is formed to be contact with at least a portion of respective the first region 31 and the second region 7.

(O) After (M), the P-type diffusion layer 10 is changed into an N-type diffusion layer 15.

Figure 1:
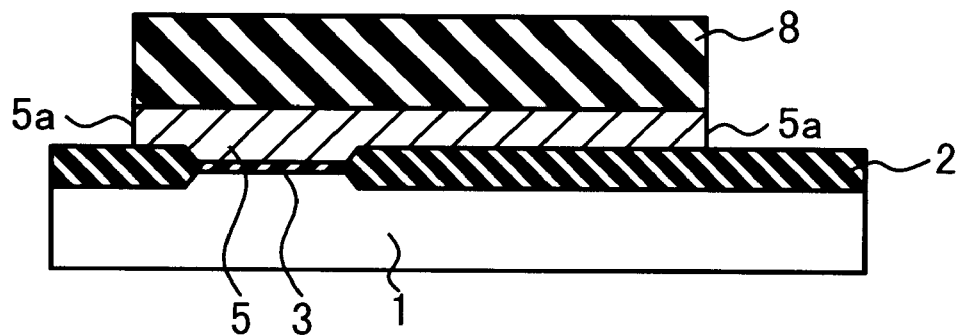
FIG. 1 is a section view showing a step of a manufacturing process in a conventional technique.
Figure 2:
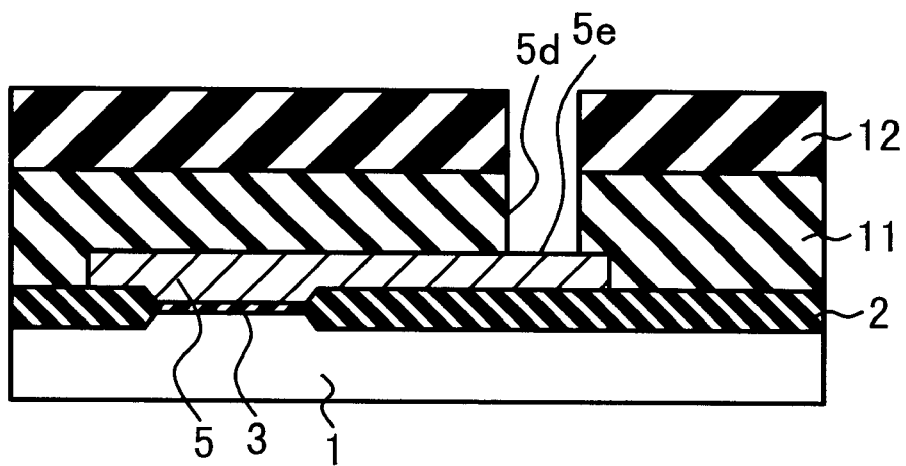
FIG. 2 is a section view showing a step after the step in FIG. 1.
Figure 3:
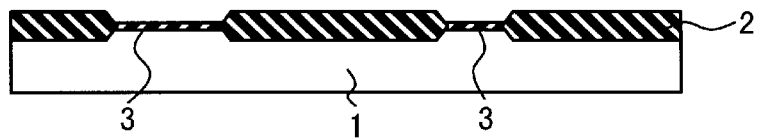
FIG. 3 is a section view showing a step of a manufacturing process in another conventional technique.
Figure 4:
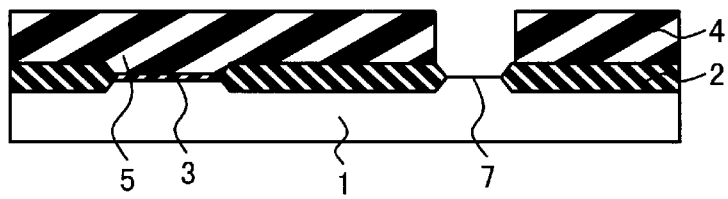
FIG. 4 is a section view showing a step after the step in FIG. 3.
Figure 5:
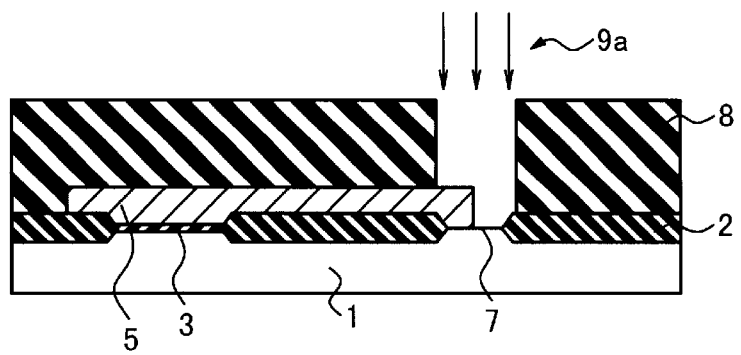
FIG. 5 is a section view showing a step after the step in FIG. 4.
Figure 6:
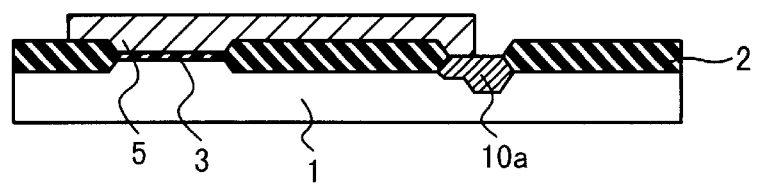
FIG. 6 is a section view showing a step after the step in FIG. 5.
Figure 7:
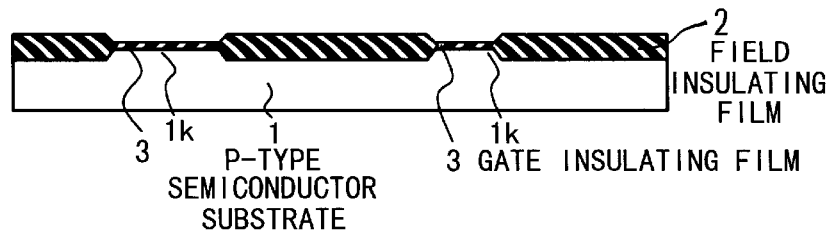
FIG. 7 is a section view showing a step of a manufacturing process in a first embodiment of a method of manufacturing a semiconductor device according to the present invention.

Firstly, the field insulating film 2 for isolation is formed on the P-type semiconductor substrate 1, as shown in FIG. 7. Each of regions surrounded with the field insulating film 2 is diffusion layer region 1k. The gate insulating film 3 is formed on the diffusion layer regions 1k of the semiconductor substrate 1.

Figure 8:
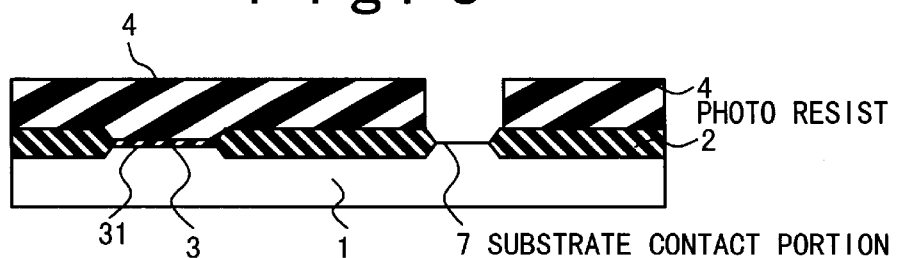
FIG. 8 is a section view showing a step after the step in FIG. 7.

Next, the gate insulating film 3 formed on one of the diffusion layer regions 1k is removed with a photo resist 4 as a mask, as shown in FIG. 8. A region in which the gate insulating film 3 is removed such that the surface portion of the semiconductor substrate 1 is exposed is referred to as a substrate contact portion 7 (a second region).

Figure 9:
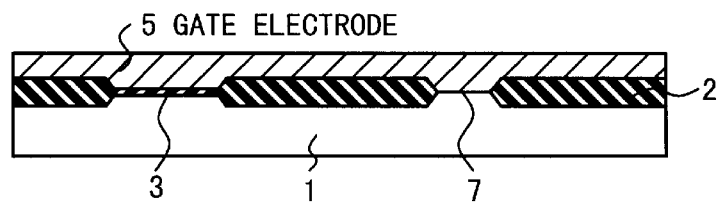
FIG. 9 is a section view showing a step after the step in FIG. 8.

Next, as shown in FIG. 9, after the removal of the photo resist 4, the gate electrode 5 is formed on the entire surface of the field insulating film 2, the gate insulating film 3 and the substrate contact portion 7. The impurity may be introduced to the gate electrode during or after the formation of the film.

Figure 10:
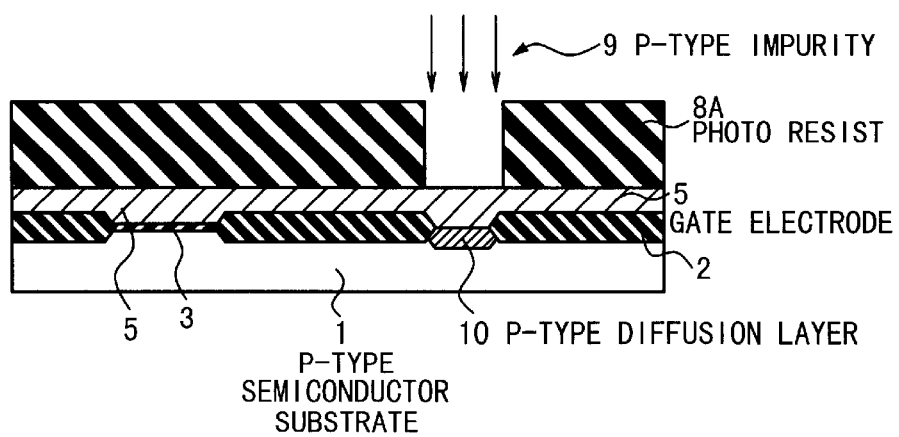
FIG. 10 is a section view showing a step after the step in FIG. 9.

Next, a photo resist 8A for masking the portion other than the substrate contact portion 7 is formed on the gate electrode 5, as shown in FIG. 10. The photo resist 8A is used as a mask to implant a P-type impurity 9, such as boron and the like, only into the substrate contact portion 7. Accordingly, the P-type diffusion layer 10 is formed in the surface portion of the substrate contact portion 7 of the semiconductor substrate 1.

From this stage, the gate electrode 5 is short-circuited through the substrate contact portion 7 (the P-type diffusion layer 10) to the semiconductor substrate 1.

If the gate electrode 5 is formed of polysilicon and N-type impurity is implanted into the gate electrode 5, PN conjunction between the gate electrode 5 and the P-type impurity (the P-type diffusion layer 10) implanted into the substrate contact portion 7 can be formed in the polysilicon 5. However, if the concentration of the impurity is relatively high, a leak current in the PN conjunction of the polysilicon 5 is large. Thus, the gate electrode 5 can be considered to be electrically short-circuited to the semiconductor substrate 1.

Figure 11:
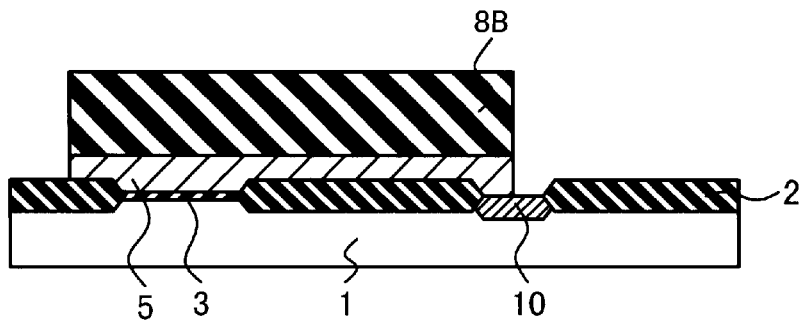
FIG. 11 is a section view showing a step after the step in FIG. 10.

Next, a photo resist 8B with a predetermined shape is formed on the gate electrode 5, as shown in FIG. 11. Then, the gate electrode 5 is etched (plasma-etched) with the photo resist 8B as a mask. As a result, the gate electrode 5 is formed such that the gate electrode 5 is in contact with a part of the P-type diffusion layer 10, and that the other part of the P-type diffusion layer 10 is exposed.

Figure 12:
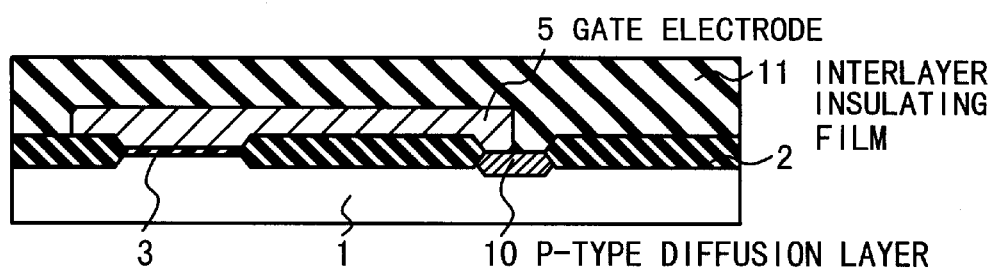
FIG. 12 is a section view showing a step after the step in FIG. 11.

Next, after the removal of the photo resist 8B, an interlayer insulating film 11 is grown on the entire section of the gate electrode 5, the P-type diffusion layer 10 and the field insulating film 2, as shown in FIG. 12.

Figure 13:
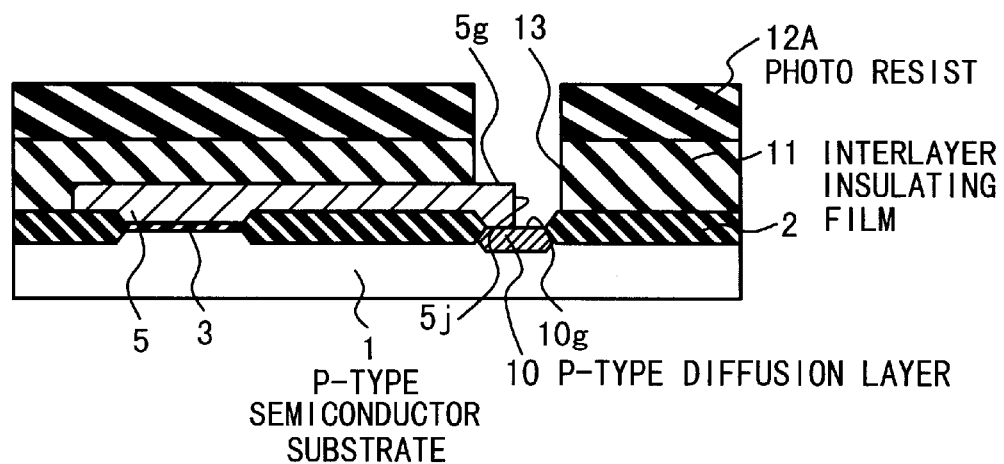
FIG. 13 is a section view showing a step after the step in FIG. 12.

After that, the interlayer insulating film 11 is etched (plasma-etched) with a photo resist 12A having a predetermined shape as a mask, as shown in FIG. 13. Accordingly, a contact hole 13 reaching the substrate contact portion 7 is formed in the interlayer insulating film 11. The contact hole 13 is formed in a region containing a surface portion 10g of the P-type diffusion layer 10, a surface portion (a top surface portion) 5g and a side portion 5j of the gate electrode 5.

Figure 14:
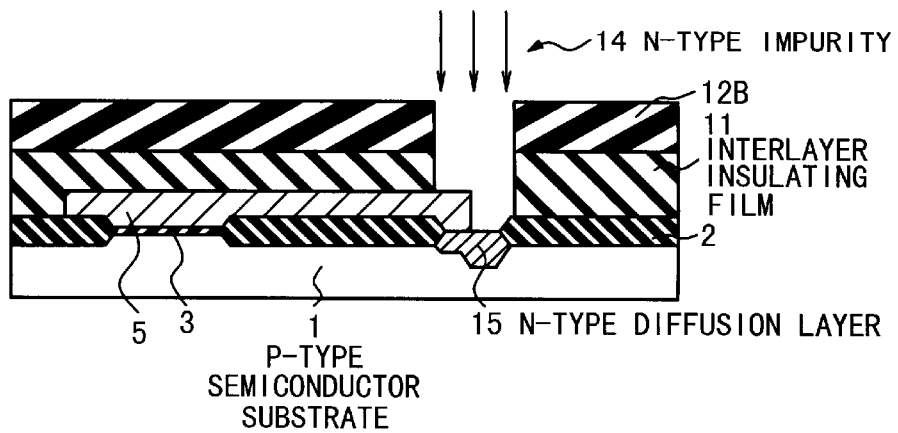
FIG. 14 is a section view showing a step after the step in FIG. 13.

N-type impurity 14, such as phosphorus, arsenic, is implanted at a high concentration into the substrate contact portion 7 through the contact hole 13, with a photo resist 12B as a mask, as shown in FIG. 14. This causes the P-type diffusion layer 10 to be changed into the N-type diffusion layer 15.

Figure 15:
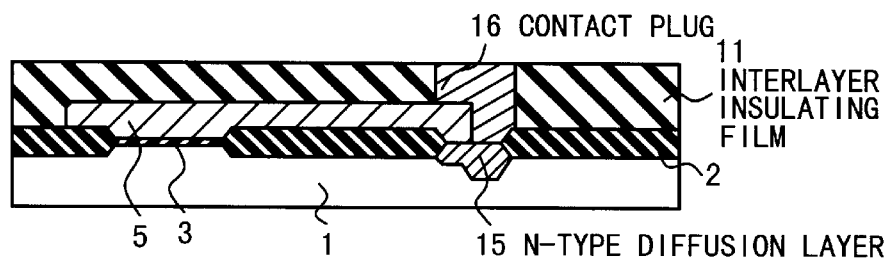
FIG. 15 is a section view showing a step after the step in FIG. 14.
Figure 16:
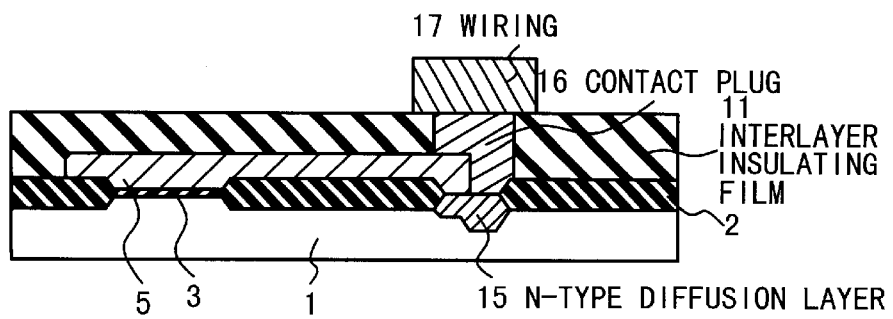
FIG. 16 is a section view showing a step after the step in FIG. 15.

Then, as shown in FIG. 15, a metal such as tungsten, aluminum, copper is filled in the contact hole 13 to form a contact plug 16. A wiring 17 is formed on the corresponding interlayer insulating film 11 on the contact plug 16.

Hence, the following effects can be attained according to the first embodiment.

When the gate electrode 5 is formed using plasma etching (FIG. 11), the gate electrode 5 is connected to the semiconductor substrate 1 through the diffusion layer 10 having the same conductive type as the semiconductor substrate 1. That is, the gate electrode 5 is electrically short-circuited to the semiconductor substrate 1. Thus, even if the gate electrode 5 is charged in the subsequent plasma process, the accumulated charges flow into the semiconductor substrate 1, and hence the gate insulating film 3 is not damaged.

After that, the diffusion layer 10 of the substrate contact portion 7 between the semiconductor substrate 1 and the gate electrode 5 is changed into the diffusion layer 15 having the opposite conductive type to that of the semiconductor substrate 1 (FIG. 14), by the ion implantation after the formation of the contact hole 13 (FIG. 13), in the interlayer insulating film 11 (FIG. 12).

Potentials of the gate electrode 5 and the semiconductor substrate 1 are always fixed to the same potential, when the gate electrode 5 is short-circuited to the semiconductor substrate 1. This prevents a functional operation of the device. Then, it is necessary to electrically separate the gate electrode 5 and the semiconductor substrate 1 from each other before the perfection of the manufacturing process. Thus, after the formation of the contact hole (FIG. 13), ions having the opposite conductive type to that of the semiconductor substrate 1 are implanted into the contact portion between the gate electrode 5 and the semiconductor substrate 1, namely, the diffusion layer 10 of the substrate contact portion 7. Accordingly, the diffusion layer 10 is changed into the diffusion layer 15 having the opposite conductive type to attain the diode structure.

Usually, a step of ion implantation with a high dosage is performed to form a source/drain diffusion layer after the formation of the gate electrode 5. In the present embodiment, it is not necessary that the ion implantation of such a high dosage is performed on the substrate contact portion 7 between the gate electrode 5 and the substrate 1.

(Second Embodiment)

The second embodiment will be described below with reference to FIGS. 15 to 25.

Figure 24:
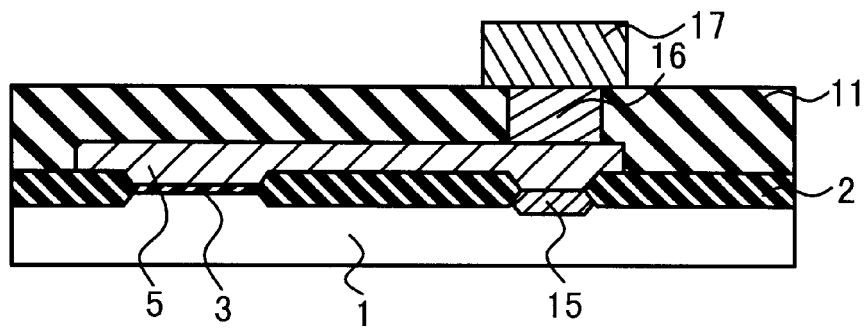
FIG. 24 is a section view showing a step after the step in FIG. 23.
Figure 25:
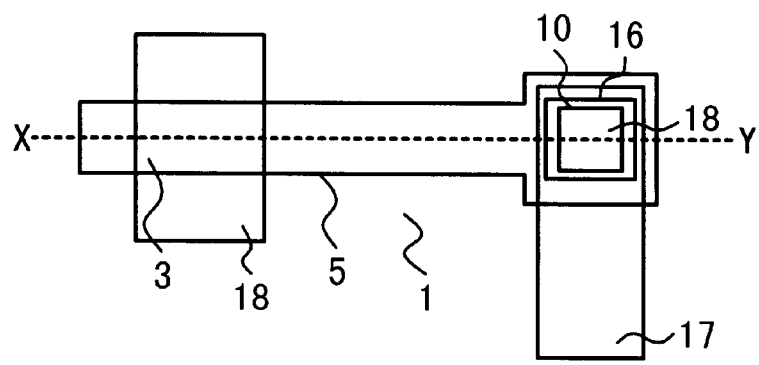
FIG. 25 is a plan view of FIG. 24.

Incidentally, FIG. 25 is a plan view corresponding to FIG. 24, and an X-Y section of FIG. 25 corresponds to FIG. 24.

In the first embodiment, only the part of the substrate contact portion 7 is covered by the gate electrode 5, and the contact hole 13 is formed over both the gate electrode 5 and the semiconductor substrate 1. In the second embodiment, a substrate contact portion 7 is completely covered by a gate electrode 5.

Figure 18:
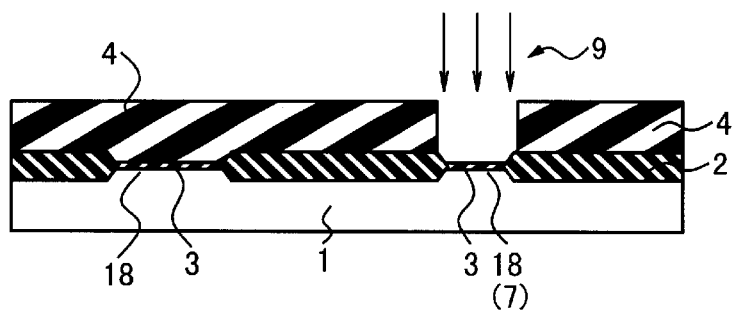
FIG. 18 is a section view showing a step of a manufacturing process in a second embodiment of a method of manufacturing a semiconductor device according to the present invention.

Firstly, a field insulating film 2 for isolating element is formed on a P-type semiconductor substrate 1, as shown in FIG. 18. A gate insulating film 3 is formed on a diffusion layer 18 (refer to FIG. 25) that is surrounded with the field insulating film 2. After that, a P-type impurity 9 is implanted into the diffusion layer 18 serving as the substrate contact portion 7, with a photo resist 4 as a mask. Accordingly, a P-type diffusion layer 10 is formed in a surface portion of the diffusion layer 18.

Figure 19:
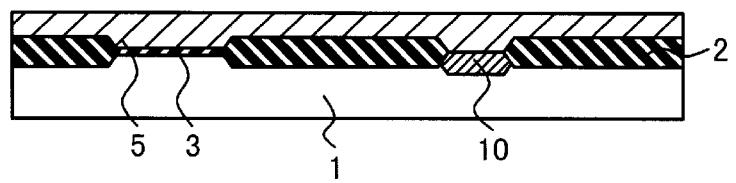
FIG. 19 is a section view showing a step after the step in FIG. 18.

At least a portion of the gate insulating film 3 of the substrate contact portion 7 is removed. Then, the gate electrode 5 is formed on the entire surface of the field insulating film 2, the gate insulating film 3 and the P-type diffusion layer 10, as shown in FIG. 19. At this stage, the gate electrode 5 is short-circuited to the P-type semiconductor substrate 1 through the substrate contact portion 7 (the P-type diffusion layer 10).

Figure 20:
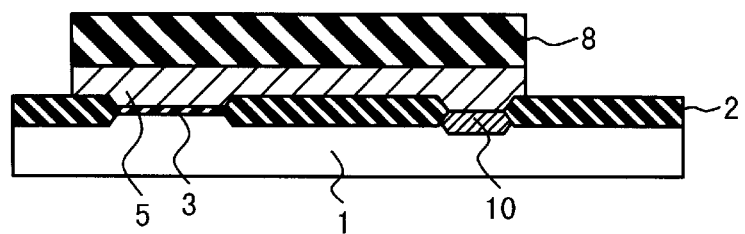
FIG. 20 is a section view showing a step after the step in FIG. 19.
Figure 21:
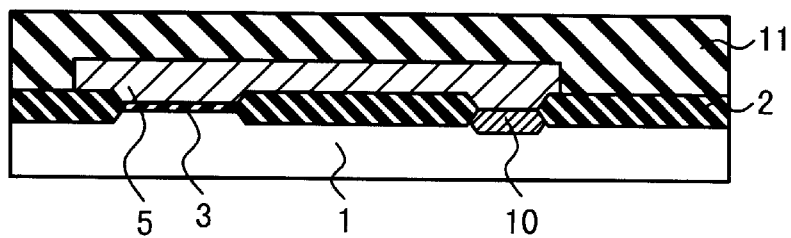
FIG. 21 is a section view showing a step after the step in FIG. 20.

Next, as shown in FIG. 20, the gate electrode 5 is etched (plasma-etched) to a predetermined shape with a photo resist 8 as a mask. After the etching, the gate electrode 5 completely covers the P-type diffusion layer 10. Then, the photo resist 8 is removed. After that, an interlayer insulating film 11 is formed on the entire surface of the gate electrode 5 and the field insulating film 2, as shown in FIG. 21.

Figure 22:
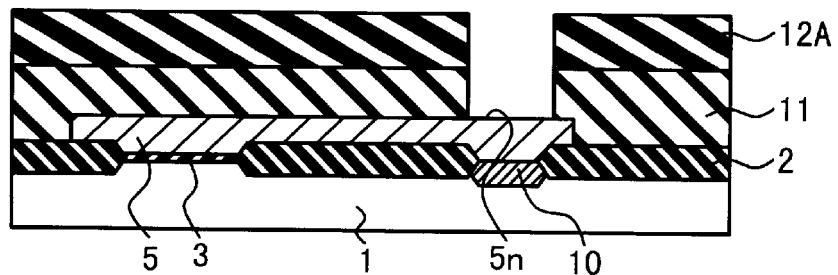
FIG. 22 is a section view showing a step after the step in FIG. 21.

After that, the interlayer insulating film 11 is removed by etching (plasma-etching) with a photo resist 12A having a predetermined shape as a mask, as shown in FIG. 22. Accordingly, a contact hole 13 that reaches a surface portion 5n of the gate electrode 5 of the substrate contact portion 7 is formed.

Figure 23:
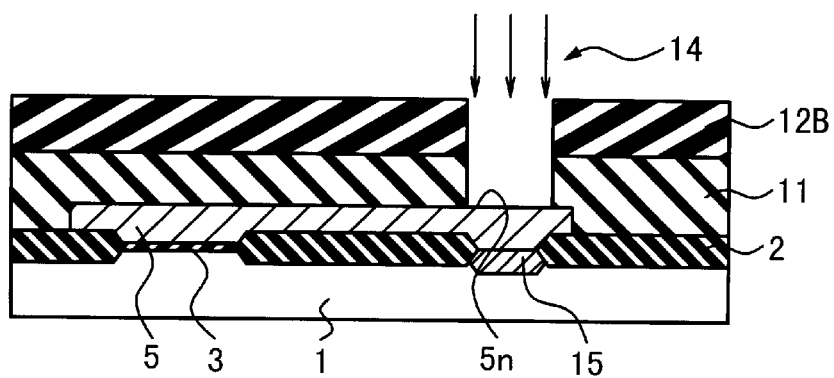
FIG. 23 is a section view showing a step after the step in FIG. 22.

Next, N-type impurity 14, such as phosphorus, arsenic, is implanted into the P-type diffusion layer 10, within the contact hole 13 of the substrate contact portion 7, with a photo resist 12B as a mask, as shown in FIG. 23. In this case, the N-type impurity 14 is implanted at a high concentration, which causes the P-type diffusion layer 10 to be changed into an N-type diffusion layer 15. After that, as shown in FIG. 24, a metal such as tungsten, aluminum, copper are filled in the contact hole 13 to form a contact plug 16. Moreover, a wiring 17 having a predetermined shape is formed on the contact plug 16.

In this embodiment, the semiconductor substrate 1 (the P-type diffusion layer 10) of the substrate contact portion 7 is not exposed when the gate electrode 5 is etched, as shown in FIG. 20. Thus, the semiconductor substrate 1 is never etched. Hence, a step on the surface of the semiconductor substrate 1 of the substrate contact portion 7 does not exist. Therefore, the problem such as the leak current due to this step does not occur.

In the first embodiment, the contact hole 13 of the substrate contact portion 7 is formed over both the P-type diffusion layer 10 on the semiconductor substrate 1 and the gate electrode 5. Conversely in the second embodiment, the contact hole 13 is formed only on the surface portion 5n of the gate electrode 5. Thus, it is easier to form the contact hole 13 in this embodiment.

(Third Embodiment)

The first and the second embodiments describe only the case in which the gate electrode 5 is the gate electrode of the N-type transistor. However, the present invention can be applied to a case in which transistors of the N-type and the P-type share a single gate electrode. Its example will be described below.

Figure 26:
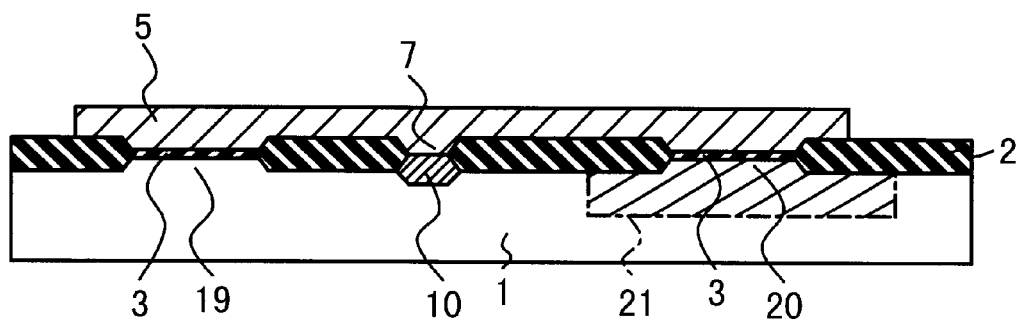
FIG. 26 is a section view showing a step of a manufacturing process in a third embodiment of a method of manufacturing a semiconductor device according to the present invention.
Figure 27:
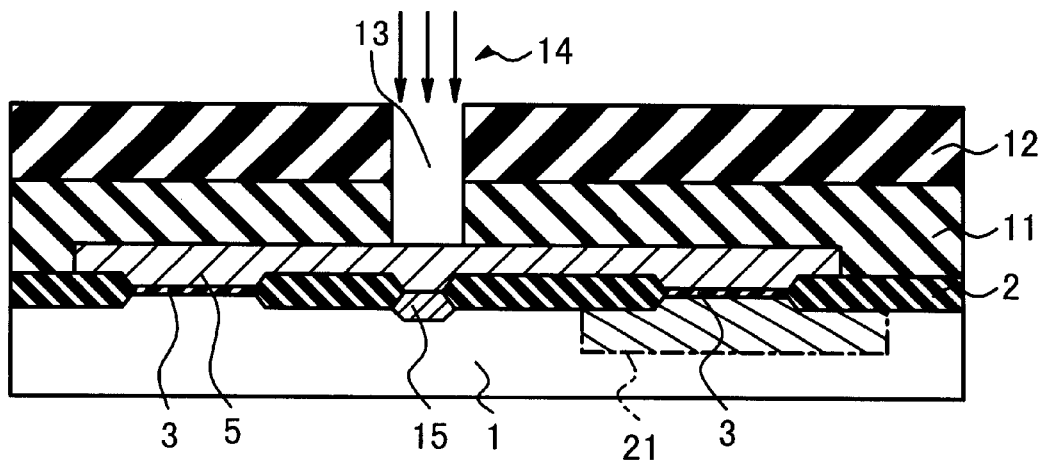
FIG. 27 is a section view showing a step after the step in FIG. 26.
Figure 28:
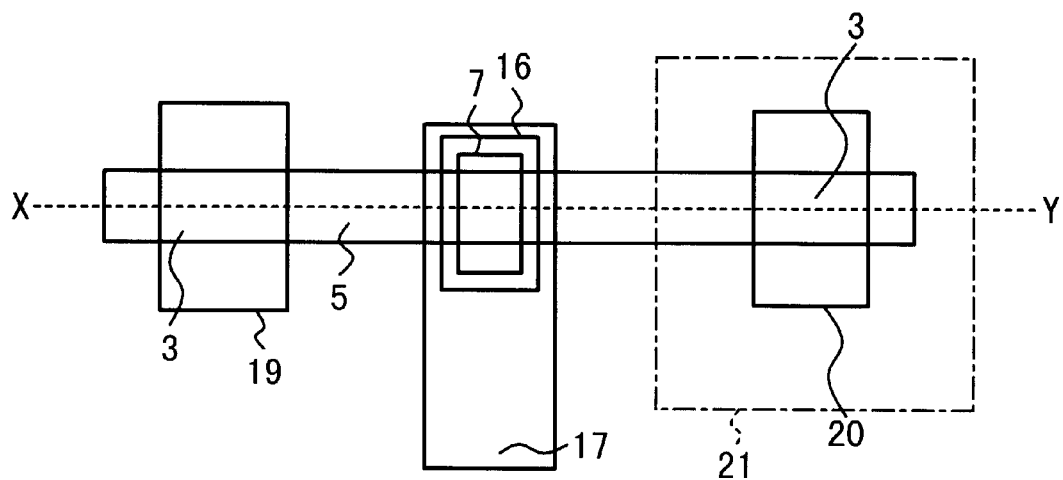
FIG. 28 is a plan view of FIG. 27.

FIGS. 26 and 27 are section views showing a method of manufacturing this example, FIG. 28 is a plan view corresponding to FIG. 27, and an X-Y section of FIG. 28 corresponds to FIG. 27.

As shown in FIG. 26, a P-type semiconductor substrate 1 has a region serving as a diffusion layer 19 of an N-type transistor, a region serving as a diffusion layer 20 of a P-type transistor and a region serving as a substrate contact portion 7 surrounded with a field insulating film 2.

The diffusion layer 20 of the P-type transistor is formed in an N-type well 21. A gate insulating film 3 is formed on the diffusion layers 19, 20. The gate insulating film 3 of the substrate contact portion 7 is removed. A gate electrode 5 having a predetermined shape is formed over the diffusion layers 19, 20 and the substrate contact portion 7. At this stage, the gate electrode 5 is short-circuited to the P-type semiconductor substrate 1 through a P-type diffusion layer 10 of the substrate contact portion 7.

Thus, if the gate electrode 5 is charged after this step, the charges flow through the substrate contact portion 7 to the semiconductor substrate 1.

After that, an interlayer insulating film 11 is grown on the entire surface of the gate electrode 5 and the field insulating film 2. Next, the interlayer insulating film 11 is etched (plasma-etched), with a photo resist 12 as a mask, to form a contact hole 13 reaching a top portion of the substrate contact portion 7.

N-type impurity 14, such as phosphorus, arsenic, is implanted at a high concentration into the substrate contact portion 7, with a photo resist 12 as a mask, as shown in FIG. 27. This causes the P-type diffusion layer 10 to be changed into an N-type diffusion layer 15.

Also in this embodiment, the charges of the gate electrode 5 can be perfectly protected between the steps of forming the substrate contact portion 7 and a step of implanting the opposite conductive type of ions into the substrate contact portion 7.

Moreover, this embodiment also has the effect that the N-type transistor and the P-type transistor can be protected at the same time.

Since the method of manufacturing the semiconductor device according to the present invention has the above-mentioned configuration, the gate electrode is electrically short-circuited to the semiconductor substrate, in the steps from the step of forming the substrate contact portion to the step of implanting the ions of the opposite conductive type into the substrate contact portion. Thus, even if the gate electrode is charged, the charges flow into the semiconductor substrate. Hence, the gate insulating film can be perfectly protected from being damaged.

That is, in the present invention, the gate insulating film is protected regardless of the polarity of the charging of the gate electrode.

What is claimed is:

1. A method of manufacturing a semiconductor device, comprising:
    (a) providing a semiconductor substrate of a first conductive type;
    (b) forming field isolation regions on said semiconductor substrate;
    (c) providing first and second nonisolation regions in which said field isolation regions are not formed on said semiconductor substrate;
    (d) forming a gate insulating film on said first and second non-isolation regions at a same time;
    (e) removing said gate insulating film formed on said second non-isolation region to form a contact portion of said semiconductor substrate;
    (f) forming a diffusion layer of said first conductive type in said second non-isolation region from which said gate insulating film is removed;
    (g) forming a gate electrode after said (f) step such that said gate electrode is in contact with at least a portion of said second non-isolation region; and
    (h) after forming said gate insulating film, transforming said diffusion layer into a diffusion layer of a second conductive type different from said first conductive type.

2. A method of manufacturing a semiconductor device according to claim 1, wherein said (h) step comprises implanting ions of said second conductive type into said diffusion layer of said first conductive type.

3. A method of manufacturing a semiconductor device according to claim 2, wherein said ions comprise one of phosphorus ions and arsenic ions.

4. A method of manufacturing a semiconductor device according to claim 1, wherein said (h) step comprises transforming all of said first conductive type of diffusion layer into said second conductive type of diffusion layer such that said first conductive type of diffusion layer does not remain.

5. A method of manufacturing a semiconductor device according to claim 1, wherein said (c) step comprises providing two said first non-isolation regions such that one of said two first non-isolation regions is provided in a well of said second conductive type formed in said semiconductor substrate, and
    wherein said method further comprises:
        (q) forming a field effect transistor of said first conductive type and a field effect transistor of said second conductive type, respectively, in said two first non-isolation regions.

6. A method of manufacturing a semiconductor device according to claim 5, wherein said gate electrode comprises a single gate electrode common to both of said first conductive type of field effect transistor and said second conductive type of said field effect transistor such that said gate electrode is connected through said second non-isolation region to said semiconductor substrate.

7. A method of manufacturing a semiconductor device according to claim 1, wherein said gate insulating film is protected from a charge accumulating on said gate electrode, regardless of a polarity of said charge.

8. A method of manufacturing a semiconductor device according to claim 1, wherein a source/drain diffusion layer is formed concurrently with said transforming said diffusion layer into a diffusion layer of a second conductive type.

9. A method of manufacturing a semiconductor device, comprising:
   (i) providing a semiconductor substrate of a first conductive type;
   (j) forming field isolation regions on said semiconductor substrate;
   (k) providing first and second nonisolation regions in which said field isolation regions are not formed on said semiconductor substrate;
   (l) forming a gate electrode on a gate insulating film in said first non-isolation region;
   (m) forming a first conductive type of diffusion layer in said second non-isolation region;
   (n) connecting said gate electrode through said diffusion layer to said semiconductor substrate;
   (o) after forming said gate insulating film, transforming said diffusion layer into a diffusion layer of a second conductive type different from said first conductive type; and
   (p) connecting said gate electrode to said semiconductor substrate, through a diode of said second conductive type of diffusion layer and said semiconductor substrate.

10. A method of manufacturing a semiconductor device, comprising:
    (r) providing a semiconductor substrate of a first conductive type and a gate electrode on a gate insulating film above said semiconductor substrate;
    (s) short-circuiting said gate electrode to said semiconductor substrate; and
    (t) using plasma process after said (s) step,
    wherein said short-circuiting said gate electrode comprises forming a diffusion layer of said first conductive type in said semiconductor substrate such that said diffusion layer is connected to said gate electrode.

11. A method of manufacturing a semiconductor device according to claim 10, further comprising:
    (u) electrically separating said gate electrode and said semiconductor substrate from each other, after said (t) step.

12. A method of manufacturing a semiconductor device according to claim 11, wherein said (u) step comprises implanting impurity ions of a second conductive type different from that of said first conductive type into said diffusion layer to transform said diffusion layer into a diffusion layer of said second conductive type.

13. A method of manufacturing a semiconductor device according to claim 11, wherein said (t) step comprises etching an insulating film formed on said gate electrode with said plasma to form a hole reaching said gate electrode, and
    said (u) step comprises implanting impurity of a second conductive type different from said first conductive type into said diffusion layer through said hole to change said diffusion layer into a diffusion layer of said second conductive type.

14. A method of manufacturing a semiconductor device according to claim 10, wherein said (t) step comprises etching said gate electrode with said plasma.

15. A method of manufacturing a semiconductor device according to claim 10, wherein said (t) step comprises etching an insulating film formed on said gate electrode with said plasma to form a hole reaching said gate electrode.

16. A method of manufacturing a semiconductor device, comprising:
    (aa) providing a semiconductor substrate of a first conductive type;
    (ab) forming field isolation regions on said semiconductor substrate;
    (ac) providing first and second non-isolation regions in which said field isolation regions are not formed on said semiconductor substrate;
    (ad) forming a gate insulating film on said first and second non-isolation regions;
    (ae) removing said gate insulating film formed on said second non-isolation region to expose a contact portion of said semiconductor substrate;
    (af) forming a gate electrode on said gate insulating film of said first non-isolation region and on said second non-isolation region in which said contact portion of said semiconductor substrate is exposed;
    (ag) implanting impurity ions of said first conductive type into said second non-isolation region to form a diffusion layer of said first conductive type;
    (ah) etching said gate electrode such that said gate electrode is in contact with a first portion of said diffusion layer and a second portion of said diffusion layer is exposed;
    (ai) forming an interlayer insulating film on said gate electrode and said diffusion layer;
    (aj) etching said interlayer insulating film to form a hole reaching said gate electrode and said diffusion layer; and
    (ak) after forming said gate insulating film, implanting impurity ions of a second conductive type different from said first conductive type through said hole into said diffusion layer to form a diffusion layer of said second conductive type.

17. A method of manufacturing a semiconductor device according to claim 16, further comprising:
    (al) filling conductive material in said hole.

18. A method of manufacturing a semiconductor device according to claim 16, wherein said (ah) step comprises etching said gate electrode with plasma.

19. A method of manufacturing a semiconductor device according to claim 16, wherein said (aj) step comprises etching said interlayer insulating film with plasma.

20. A method of manufacturing a semiconductor device according to claim 16, wherein said impurity ions of said first conductive type comprise boron ions.

21. A method of manufacturing a semiconductor device, comprising:
    (am) providing a semiconductor substrate of a first conductive type;
    (an) forming a field isolation region on said semiconductor substrate;
    (ao) providing first and second non-isolation regions in which said field isolation regions are not formed on said semiconductor substrate;
    (ap) forming a gate insulating film on said first and second non-isolation regions;

(aq) implanting impurity ions of said first conductive type into said second non-isolation region to form a diffusion layer of said first conductive type;

(ar) after said (aq) step, removing at least a portion of said gate insulating film in said second non-isolation region to expose a contact portion of said semiconductor substrate;

(as) forming a gate electrode on said first and second non-isolation regions and said field isolation regions;

(at) etching said gate electrode such that said gate electrode covers an entire surface portion of said diffusion layer;

(au) forming an interlayer insulating film on said gate electrode;

(av) etching said interlayer insulating film such that a hole reaching said gate electrode is formed; and (aw) after forming said gate insulating film, implanting impurity of a second conductive type different from said first conductive type into said diffusion layer through said hole to form a diffusion layer of said second conductive type.

22. A method of manufacturing a semiconductor device according to claim 21, further comprising:

(ax) filling conductive material in said hole.

23. A method of manufacturing a semiconductor device according to claim 21, wherein said (at) step comprises etching said gate electrode with plasma.

24. A method of manufacturing a semiconductor device according to claim 21, wherein said (av) step comprises etching said interlayer insulating film with plasma.

25. A method of manufacturing a semiconductor device, comprising:

(ba) providing a semiconductor substrate of a first conductive type;

(bb) forming field isolation regions on said semiconductor substrate;

(bc) providing first, second and third non-isolation regions in which said field isolation regions are not formed on said semiconductor substrate, wherein said first non-isolation region is a region to be a diffusion layer of a second conductive type different from said first conductive type, and said third non-isolation region is a region to be a diffusion layer of said first conductive type;

(bd) forming a gate insulating film on said first and third non-isolation regions;

(be) forming a diffusion layer of said first conductive type in said second non-isolation region;

(bf) forming a gate electrode on said gate insulating film in said first and third non-isolation regions, said diffusion layer in said second non-isolation region and said field isolation regions; and (bg) after forming said gate insulating film, transforming said diffusion layer into a diffusion layer of said second conductive type.

* * * * *